United States Patent [19]
Handy

[11] 3,875,656
[45] Apr. 8, 1975

[54] FABRICATION TECHNIQUE FOR HIGH DENSITY INTEGRATED CIRCUITS

[75] Inventor: Robert M. Handy, Phoenix, Ariz.

[73] Assignee: Motorola, Inc., Chicago, Ill.

[22] Filed: July 25, 1973

[21] Appl. No.: 382,626

[52] U.S. Cl. ...................... 29/571; 29/577; 29/578; 29/580
[51] Int. Cl. ........................................... H01l 11/14
[58] Field of Search ............ 29/571, 577, 578, 580, 29/591, 589, 590; 317/235

[56] References Cited

UNITED STATES PATENTS 3,636,418 1/1972 Burns et al. ........................ 317/235

OTHER PUBLICATIONS

Bazin, B. *Samnos Technology*, in Solid State Electronics, 1972, Vol. 15, No. 6, pp. 649–651.

*Primary Examiner*—Roy Lake
*Assistant Examiner*—Craig R. Feinberg
*Attorney, Agent, or Firm*—Vincent J. Rauner; Charles R. Hoffman

[57] ABSTRACT

A method for fabricating an array of high density single field-effect transistor, electrically alterable memory devices, wherein no ohmic contacts are required within the array and self-aligning devices are provided. A plurality of substantially vertical parallel elongated regions of silicon are provided on an insulating substrate, each elongated region having a plurality of openings therein. The plurality of rectangular silicon nitride-silicon dioxide composite gate insulator regions are provided on the elongated silicon regions, each composite insulator region extending between two of said openings. The silicon nitride insulator regions act as diffusion masks and also as oxidation masks during subsequent diffusion and thermal oxidation steps. A plurality of substantially horizontal parallel metal regions are provided on the exposed surface, each acting as the gate electrode for all of the electrically alterable memory devices in a given row.

7 Claims, 8 Drawing Figures

FABRICATION TECHNIQUE FOR HIGH DENSITY INTEGRATED CIRCUITS

BACKGROUND OF THE INVENTION

1. Field of the Invention

The invention relates to methods of making monolithic semiconductor devices, and more particularly to methods for making arrays of nonvolatile, self-aligning electrically alterable memory devices.

2. Description of the Prior Art

MNOS transistors have been utilized as relatively nonvolatile, electrically alterable memory elements, although considerable difficulty in reliably manufacturing such devices has been encountered. A more detailed description of the MNOS transistor characteristics is found in "The Metal-Nitride-Oxide-Silicon (MNOS) Transistor — Characteristics and Applications," Dov Frohman-Bentchkowsky, *Proceedings of the IEEE*, Vol. 58, No. 8, August 1970, p. 1207. In general, the MNOS transistor memory, which achieves bistable logic states from flat band shifts due to charged storage at the silicon dioxide-silicon nitride interface during polarization pulses, contains two column sense lines for the transistor source and drain, respectively, and one row address line for the transistor gate. In the well-known metal gate MNOS technology, the memory cell utilizes a metal row address line, thereby eliminating ohmic contacts from the row line to the transistor gates. However, in the metal gate technology, self-alignment between the metal gate electrode and the source and drain regions is not achievable, and gate-to-source and gate-to-drain overlap tolerances must be incorporated into the devices. Such tolerances increase the size of the memory cell and degrade its performance due to the presence of the overlap capacitances caused by the overlapping. Self-aligned field-effect transistor devices have been achieved in the art by utilizing polycrystalline silicon gate electrodes which are doped at the same time that the source and drain regions are diffused, providing self-aligned structures. However, the prior art self-aligned gate technology requires ohmic contact from the metal row address lines to the doped polycrystalline silicon gate electrodes, thereby greatly increasing the required area per cell.

The invention solves the aforementioned problems of prior art MNOS devices by providing a method of producing such devices on insulating substrates wherein columns of semiconductor material are electrically continuous and wherein silicon gate MNOS transistors may be used as the nonvolatile memory element without requiring ohmic contacts thereto at each memory cell location.

SUMMARY OF THE INVENTION

It is an object of this invention to provide an improved method for fabricating monolithic semiconductor arrays.

It is another object of this invention to provide an improved method of making relatively nonvolatile, electrically alterable high density memory arrays wherein self-aligned devices are provided without the necessity for providing ohmic contacts at each memory cell.

Briefly described, the invention provides a method for making a monolithic array of nonvolatile, self-aligned, electrically alterable memory devices. A plurality of spaced, parallel, lightly doped semiconductor regions are provided on an insulating substrate, each of the regions having therein a plurality of spaced openings exposing the insulating substrate. A plurality of regions of composite dielectric layer, which may be silicon nitride-silicon dioxide, are provided on the parallel silicon regions, each dielectric layer region extending, respectively, between a corresponding pair of said openings. The exposed regions of silicon are heavily doped by passing impurities therein, said composite dielectric regions acting as a mask. The composite dielectric regions then act as an oxidation mask during thermal oxidation of the exposed silicon. A plurality of spaced, essentially parallel and horizontal regions of conductive material are provided to form gate electrodes for each row of said composite dielectric regions.

DESCRIPTION OF THE INVENTION

Figures 1, 2A, 2B, 3A, 3B, 4, 5A, 5B:
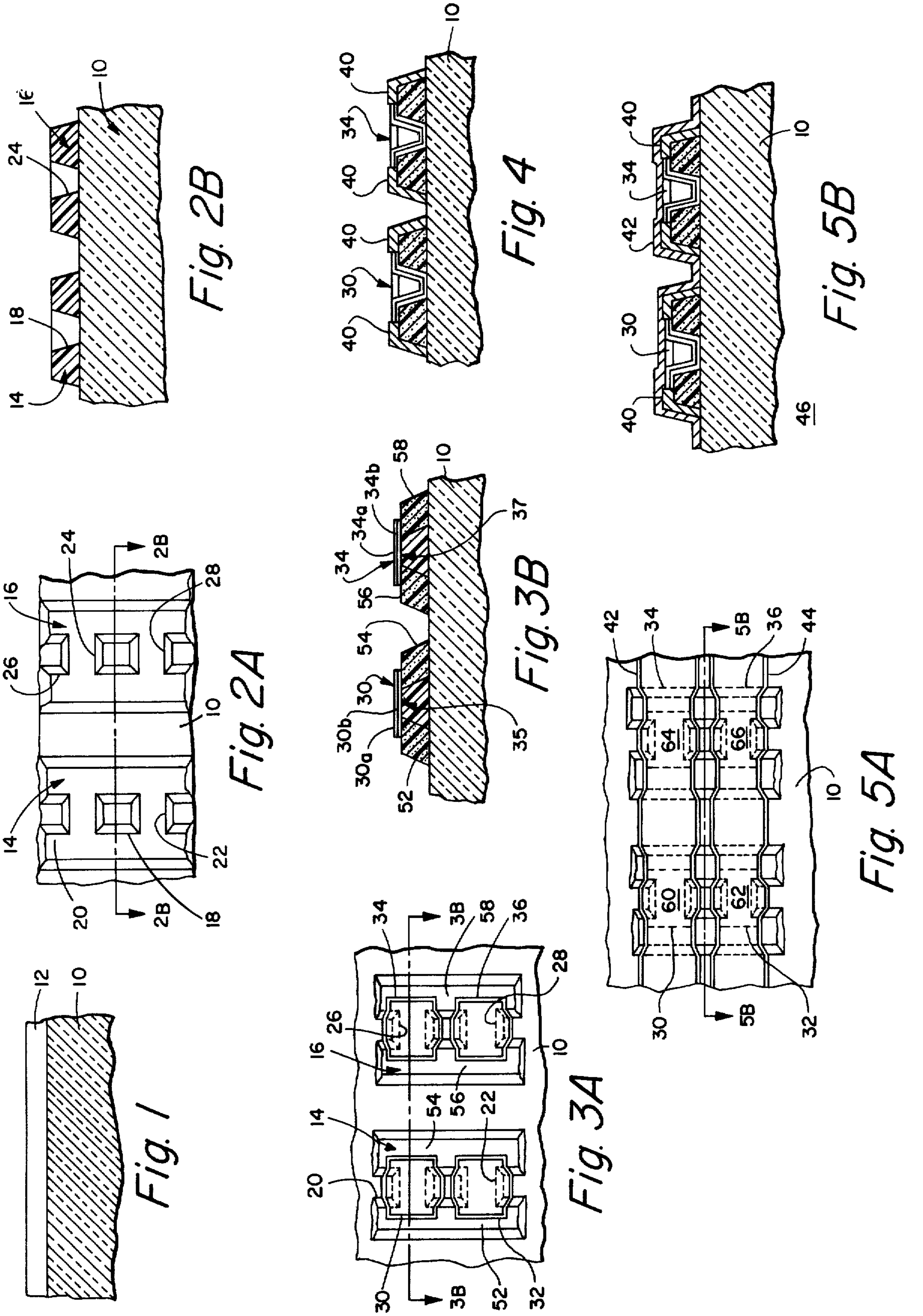
FIG. 1 is a cross-sectional diagram useful in describing the method of the invention.
FIG. 2*a* is a plan view of the device shown in FIG. 1 illustrating the process of the invention.
FIG. 2*b* is a sectional diagram taken substantially along the lines 2*b*—2*b*.
FIG. 3*a* is a plan view illustrating additional steps of the invention.
FIG. 3*b* is a sectional view taken substantially along the lines 3*b*—3*b*.
FIG. 4 is a sectional view similar to FIG. 2*b* illustrating additional processing steps according to the invention.
FIG. 5*a* is a plan view of a portion of a completed device according to the method of the invention.
FIG. 5*b* is a sectional diagram taken substantially along the lines 5*b*—5*b*.

The invention, in a preferred embodiment thereof, provides a method for making a high density array of electrically alterable MNOS memory elements. Such memory elements may be used as resettable ROM (Read Only Memory) devices or as RAM (Random Access Memory) devices.

A preferred method for making such an array, according to the invention, is described with reference first to FIG. 1, wherein a layer of single crystal silicon is provided, by epitaxial growth, on an insulating substrate 10. Insulating substrate 10 may, for example, be spinel or sapphire. Silicon layer 12 is relatively lightly doped, and has its impurity concentration chosen to provide the desired threshold voltage in subsequently formed MNOS transistors.

Referring to FIG. 2*a*, silicon layer 12 of FIG. 1 is patterned, using conventional photolithographic and etching techniques, to provide a plurality of substantially parallel elongated silicon regions 14 and 16 which have, respectively, openings 18, 20 and 22, and 24, 26 and 28 therein. Said openings are sufficiently deep to expose insulating substrate 10, as is clearly depicted in FIG. 2*b*.

Referring to FIGS. 3*a* and 3*b*, the next step is providing a plurality of composite dielectric regions 30, 32, 34 and 36. Composite dielectric region 30 extends across the silicon between openings 18 and 20. Insulator 32 spans the silicon region between openings 18 and 22, and insulator 34 covers the silicon between openings 24 and 26. Insulator 36 covers the silicon between openings 24 and 28. The composite insulator regions 30, 32, 34 and 36 are preferably formed by thermally growing a thin layer of silicon dioxide on silicon regions 14 and 16. The thickness of the thin silicon dioxide layer may range from 15 to 200 angstrom units, depending on the desired characteristics of subsequently formed memory devices with respect to write voltage, write pulse width, and nonvolatility. (The write voltage is the voltage required to alter the stored state of the memory element.) Then, a relatively thick (for example, 200 to 1,500 angstrom units in thickness) silicon nitride layer is formed, preferably by deposition techniques well known in the art, on the thin silicon dioxide layer. Then, utilizing conventional photolithographic techniques and conventional etching techniques, the spaced composite insulator regions 30, 32, 34 and 36 are formed. The silicon nitride-silicon dioxide composite insulator layers extend down into the openings to the insulating substrate 10, as is clearly shown in FIG. 3*a*. The thin silicon dioxide portions of composite insulators 30 and 34 are indicated, respectively, by reference numerals **30*b* and 34*b*** in FIG. 3*b*, and the silicon nitride portions thereof are designated by reference numerals **30*a* and 34*a***, respectively.

The next step, according to the invention, is to heavily dope the exposed portions of silicon regions 14 and 16 with impurities of a conductivity opposite to that of the original light doping of said silicon regions, with composite gate insulators 30, 32, 34 and 36 acting as masks against the doping process. The exposed portions of regions 14 and 16 form first and second heavily doped elongated continuous regions which are substantially vertical and parallel, and which form the source and drain regions of the subsequently formed MNOS transistor devices. The first and second vertical, heavily doped elongated regions of silicon region 14 are indicated in FIG. 3*a* by reference numerals 52 and 54, while first and second vertical, elongated, heavily doped regions of silicon region 16 are indicated by reference numerals 56 and 58, as is also shown in FIG. 3*b*. The doping process is preferably accomplished by conventional vapor predeposition and drive-in diffusion techniques, or by predeposition by ion implantation and subsequent drive-in diffusion techniques, the composite insulator regions acting as masks in either case. The channel regions of the transistor devices are in the remaining lightly doped regions of silicon layer 12. Two such channel regions are depicted in FIG. 3*b* by reference numerals 35 and 37, corresponding, respectively, to transistors 60 and 64 of FIG. 5*a*.

Referring to FIG. 4, which is viewed along the same section lines as FIG. 2*b*, the next step of the method according to the invention is to thermally grow an oxide layer 40 on the exposed portions of silicon; the composite gate dielectric regions act as masks against the thermal oxidation of unexposed silicon.

Referring to FIGS. 5*a* and 5*b*, the final steps of the method according to the invention include forming conductive layers 42 and 44 on the surface of the array by forming a conductive layer on the upper surface using well known methods such as metal vacuum evaporation and patterning the conductive layer using well known photoresist and etching techniques. Conductive layers 44 and 42 are spaced and substantially horizontal and conductive films, each serves as a gate electrode for a row of MNOS transistors. For example, conductive region 42 acts as the gate electrode on insulators 30 and 34, forming MNOS transistors 60 and 64, respectively. Similarly, conductive layer 44 serves as the gate electrode for composite insulators 32 and 36, forming MNOS transistors 62 and 66, respectively. Of course, as is clear from the illustration, the array can include any number of columns and any number of rows of MNOS memory devices.

According to the present invention, conductive lines 42 and 44 may be either metal or heavily doped polycrystalline silicon. The source and drain regions are common to all MNOS transistors in a given column, and are formed by the elongated regions 52, 54, 56, and 58.

In summary, it is seen that the method of the invention provides a matrix or array of MNOS transistor memory devices which are self-aligned to the source and drain regions by utilizing the gate dielectric regions as masks against the doping process which forms the vertical elongated source and drain regions. This provides advantages in component density and in circuit performance due to the reduction of the overlap capacitances. Further, the method of the invention provides a structure in which preohmic contacts to each transistor are not required, even for silicon gate devices.

Although the invention has been described in relation to a paticular embodiment thereof, it will be readily seen by those skilled in the art that variations in order of processing steps may be made within the scope of the invention to suit varying requirements.

What is claimed is:

1. A method for making an integrated circuit comprising the steps of:

forming a first layer of relatively lightly doped semiconductor material of a first conductivity type on an insulating substrate;

removing portions of said first layer to provide a plurality of spaced elongated regions, each of said elongated regions being isolated, each of said elongated regions having a plurality of spaced openings therein exposing said insulating substrate;

forming a composite dielectric layer on said elongated regions;

removing portions of said composite dielectric layer, thereby forming a plurality of gate dielectric regions on said elongated regions, each of said gate dielectric regions extending, respectively, between a pair of said spaced openings, leaving exposed first and second elongated sections of each of said elongated regions;

passing impurities into and heavily doping said exposed first and second elongated sections, said composite dielectric layer acting to mask said passing of said impurities;

forming a first insulator on said exposed first and second elongated sections;

forming a conductive layer on an entire upper surface of said integrated circuit; and removing portions of said conductive layer to form a plurality of spaced conductors, each of said spaced conductors acting as gate electrodes on at least one of said gate dielectric regions.

2. The method as recited in claim 1 wherein said dielectric layer is a composite dielectric layer including a first dielectric layer on said elongated region and a second dielectric layer on said first dielectric layer.

3. The method as recited in claim 2 wherein said first layer of semiconductor material is silicon, and said insulating substrate is sapphire.

4. The method as recited in claim 2 wherein said first dielectric layer is silicon dioxide having thickness in the range from 15 to 200 angstrom units, and said second dielectric layer is silicon nitride having thickness in the range from 200 to 1,500 angstrom units.

5. The method as recited in claim 2 wherein said passing of said impurities is accomplished by diffusing said impurities into said exposed first and second elongated sections.

6. The method as recited in claim 2 wherein said passing of said impurities includes ion implanting said impurities into said exposed first and second elongated sections.

7. A method for fabricating an MNOS memory matrix comprising the steps of:

epitaxially forming a first silicon layer on an insulating substrate, said first silicon layer being single crystal, of a first conductivity type, and being relatively lightly doped;

selectively removing portions of said first silicon layer to provide a plurality of spaced, isolated elongated silicon regions arranged in columns on said insulating substrate, each of said elongated silicon regions having a plurality of openings therein, said openings being spaced and exposing said insulating substrate, said openings forming substantially horizontally aligned rows;

forming a composite dielectric layer on said elongated silicon region, said composite dielectric including a relatively thin silicon dioxide layer on said elongated silicon regions and a silicon nitride layer on said silicon dioxide layer;

selectively removing portions of said composite dielectric layer to provide a plurality of essentially rectangular dielectric regions on said elongated silicon columns, said rectangular dielectric regions being spaced and extending, respectively, between each of said openings, leaving exposed first and second elongated sections of each of said elongated silicon regions;

diffusing impurities of a second conductivity type into said exposed first and second elongated sections, said exposed first and second elongated sections to be heavily doped;

thermally growing a silicon dioxide layer on said exposed first and second elongated sections;

forming a patterned metal layer on the upper surface of said MNOS memory matrix, said patterned metal layer forming a plurality of substantially horizontal parallel conductors, each acting as a gate electrode for one of said substantially horizontally aligned rows of openings.

* * * * *